US009570025B2

(12) United States Patent
Liu

(10) Patent No.: US 9,570,025 B2
(45) Date of Patent: Feb. 14, 2017

(54) GATE DRIVING APPARATUS AND DISPLAY DEVICE

(71) Applicants: BOE TECHNOLOGY GROUP CO., LTD., Beijing (CN); HEFEI BOE OPTOELECTRONICS TECHNOLOGY CO., LTD., Anhui (CN)

(72) Inventor: Jinliang Liu, Beijing (CN)

(73) Assignees: BOE TECHNOLOGY GROUP CO., LTD., Beijing (CN); HEFEI BOE OPTOELECTRONICS TECHNOLOGY CO., LTD., Beijing (CN)

( * ) Notice: Subject to any disclaimer, the term of this patent is extended or adjusted under 35 U.S.C. 154(b) by 0 days.

(21) Appl. No.: 14/092,497

(22) Filed: Nov. 27, 2013

(65) Prior Publication Data

US 2014/0145924 A1    May 29, 2014

(30) Foreign Application Priority Data

Nov. 29, 2012    (CN) .......................... 2012 1 0500711

(51) Int. Cl.
*G09G 3/36* (2006.01)
*G11C 19/28* (2006.01)

(52) U.S. Cl.
CPC .......... *G09G 3/3677* (2013.01); *G09G 3/3674* (2013.01); *G11C 19/28* (2013.01);
(Continued)

(58) Field of Classification Search
CPC ............... G09G 3/3266; G09G 3/3674–3/3681
See application file for complete search history.

(56) References Cited

U.S. PATENT DOCUMENTS 8,508,458 B2 *  8/2013  Han et al. ...................... 345/100
8,548,115 B2 * 10/2013  Shang ............................ 377/64
(Continued)

FOREIGN PATENT DOCUMENTS

| CN | 101546607 A |   | 9/2009 |
|----|-------------|---|--------|
| CN | 102708925 A | * | 10/2012 |
| GB | 2452279 A   |   | 3/2009 |

OTHER PUBLICATIONS

Extended European Search Report dated Feb. 20, 2014; Appln. No. 13194861.4-1904.
(Continued)

*Primary Examiner* — Patrick F Marinelli
(74) *Attorney, Agent, or Firm* — Ladas & Parry LLP

(57) ABSTRACT

A gate driving apparatus and display device are provided to settle abnormal display in a full screen caused by abnormality in signals output from a shift register when short-circuit occurs in wirings associated with gate lines within a liquid crystal panel. The apparatus comprises a plurality of gate driving units connected in cascade. Each stage of the gate driving units comprises a shift register unit and a relay unit whose pulling-up control terminal is connected to an output terminal of the shift register unit, reset signal terminal is connected to a reset signal terminal of the shift register unit, pulling-down control terminal is connected to pulling-down control node of the shift register unit, first power-supply input terminal is connected to first power voltage, second power-supply input terminal is connected to second power voltage, and output terminal is connected to the gate line as output terminal of the gate driving unit.

6 Claims, 4 Drawing Sheets

(52) U.S. Cl.
CPC .............. *G09G 2300/0408* (2013.01); *G09G 2310/0286* (2013.01); *G09G 2310/0291* (2013.01)

(56) References Cited

U.S. PATENT DOCUMENTS

| | | | |
|---|---|---|---|
| 8,666,019 B2* | 3/2014 | Shang ............................ | 377/64 |
| 2002/0186196 A1* | 12/2002 | Park .............................. | 345/100 |
| 2003/0128180 A1* | 7/2003 | Kim et al. .................... | 345/100 |
| 2005/0275614 A1* | 12/2005 | Kim et al. .................... | 345/100 |
| 2007/0296662 A1* | 12/2007 | Lee et al. ....................... | 345/87 |
| 2008/0001904 A1* | 1/2008 | Kim et al. .................... | 345/100 |
| 2009/0225068 A1* | 9/2009 | Jeong et al. .................. | 345/211 |
| 2011/0057926 A1* | 3/2011 | Shang ........................... | 345/213 |
| 2011/0058640 A1* | 3/2011 | Shang et al. .................. | 377/64 |
| 2011/0156997 A1* | 6/2011 | Han et al. ..................... | 345/100 |
| 2012/0075259 A1* | 3/2012 | Chung .......................... | 345/204 |
| 2012/0262438 A1* | 10/2012 | Shang et al. .................. | 345/211 |
| 2013/0342516 A1* | 12/2013 | Shang ........................... | 345/206 |
| 2014/0133621 A1* | 5/2014 | Shang ........................... | 377/67 |
| 2014/0169518 A1* | 6/2014 | Kong et al. ................... | 377/64 |

OTHER PUBLICATIONS

First Chinese Office Action dated Apr. 17, 2014; Appln. No. 201210500711.6.
European Patent Office—Office Action dated Sep. 8, 2016; Appln. No. 13 194 861.4-1904.

* cited by examiner

GATE DRIVING APPARATUS AND DISPLAY DEVICE

TECHNICAL FIELD

The present disclosure relates to a field of liquid crystal displaying technique, and particularly, to a gate driving apparatus and a display device.

BACKGROUND

Application of a liquid crystal display device has filled in everywhere in people's life, such as a mobile phone, a game machine, a computer display, a television and the like. A traditional liquid crystal display device drives a liquid crystal panel to display generally in a manner of bonding by a gate driving IC and a source driving IC, and a driving technique for disposing a gate driver on the liquid crystal display integrally (gate in panel, GIP) arises to meet requirements for an increased resolution and a competitive cost pressure. In this technique, a gate driving circuit is composed of a plurality of thin film transistors TFTs, its manufacture process is the same as the liquid crystal display, which can reduce expenses of using the gate driving IC without increasing process difficulty and the cost.

FIG. 1 is a schematic diagram illustrating a liquid crystal display driven by the existing GIP technique. A gate driving apparatus is composed of a plurality of shift register units 1 connected in cascade, each of the shift register units corresponds to a gate driving signal line, wherein a STV (frame start signal) provides a start signal with a cycle being same as a frame frequency to the shift register unit S1; a first clock signal CLK and a second clock signal CLKB are the same but have opposite polarities, and are used for controlling the shift register to output a high level signal or a low level signal. A low level maintaining signal is provided to the shift register by VSS. An output signal from the shift register unit S1 is as a start signal for a next shift register unit S2 and provides a reset signal to the shift register unit S1 at the same time when the shift register unit S2 outputs a high level, so that the output from the S1 is at the low level to produce a progressive driving process of the liquid crystal display device.

However, since the output signal from the shift register is connected directly with the gate driving signal line, the signal output from the shift register may change abnormally when a short-circuit occurs in the wirings associated with the gate driving signal lines (for example, a gate signal line and a data signal line, the gate signal line and a common electrode line) within the panel of the liquid crystal display device, which may affect visibly the resetting of the previous shift register and the turning-on of the next shift register and in turn cause a disorder in timings and operation states of all of the shift registers, such that a display in a full screen is abnormal or fails. This problem may also affect seriously the research and analysis of reasons for the defect of the abnormality in a picture displaying, which will be made by engineers, and it is not benefit for increasing the product yield.

SUMMARY

Embodiments of the present disclosure provide a gate driving apparatus and a display device to settle an abnormal display in a full screen caused by an abnormality in signals output from a shift register, when a short-circuit occurs in wirings associated with gate lines within a liquid crystal panel.

The gate driving apparatus according to the embodiments of the present disclosure comprises a plurality of gate driving units connected in cascade, wherein each stage of the gate driving units comprises a shift register unit, and a relay unit for outputting a first power voltage or a second power voltage to a gate line, wherein, a pulling-up control terminal of the relay unit is connected to an output terminal of the shift register unit, a reset signal terminal thereof is connected to a reset signal terminal of the shift register unit, a pulling-down control terminal thereof is connected to a pulling-down control node of the shift register unit, a first power-supply input terminal thereof is connected to the first power voltage, a second power-supply input terminal thereof is connected to the second power voltage, and an output terminal of the relay unit is connected to the gate line as an output terminal of the gate driving unit.

A display device according to the embodiments of the present disclosure comprises the above gate driving apparatus.

The embodiments of the present disclosure may settle an abnormal display in a full screen caused by an abnormality in signals output from a shift register, when a short-circuit occurs in wirings associated with gate lines within a liquid crystal panel, by arranging the relay unit at the output terminal of the shift register unit, making an output signal from the shift register unit of the gate driving apparatus as a pulling-up control signal of the relay unit, and providing an output signal to the gate line by the relay unit, while it is able to enhance an analysis efficiency for defective phenomena such as the normal display, etc, and increase the product yield.

DETAILED DESCRIPTION

Embodiments of the present disclosure provide a gate driving apparatus and a display device for settling an abnormal displaying in a full screen caused by an abnormality in signals output from a shift register when short-circuit occurs in wirings associated with gate lines within a liquid crystal panel.

The embodiments of the present disclosure will be described below in connection with drawings.

Figure 2:
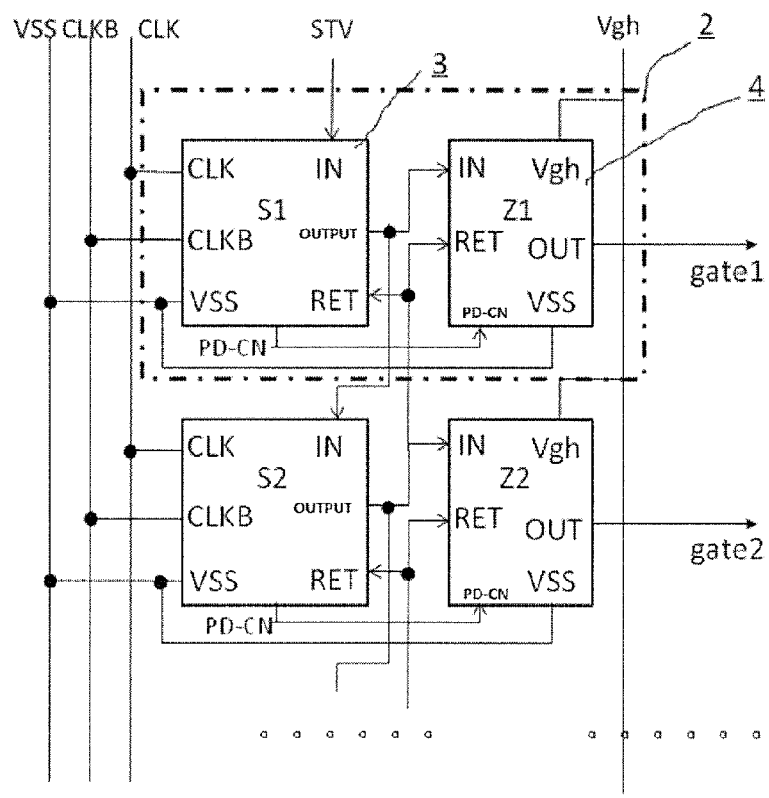
FIG. 2 is a schematic diagram illustrating a structure of a gate driving apparatus according to an embodiment of the present disclosure.

Referring to FIG. 2, the gate driving apparatus according to an embodiment of the present disclosure comprises a plurality of gate driving units 2 connected in cascade, wherein each stage of the gate driving unit 2 comprises a shift register unit 3, for example, S1, S2, etc. in FIG. 2. The shift register unit 3 comprises a pulling-down control node PD-CN. Each stage of the gate driving unit 2 further comprises a relay unit 4, for example, Z1, Z2 and the like in the figure, for outputting a first power voltage Vgh or a second power voltage VSS to a gate line.

A pulling-up control terminal IN of the relay unit is connected to an output terminal OUTPUT of the shift register unit, a reset signal terminal RET thereof is connected to a reset signal terminal RET of the shift register unit in the same stage of the gate driving unit, a pulling-down control terminal thereof is connected to a pulling-down control node PD-CN of the shift register unit in the same stage of the gate driving unit, a first power supply input terminal thereof is connected to the first power voltage Vgh, a second power supply input terminal thereof is connected to the second power voltage VSS, and an output terminal OUT of the relay unit is connected to the gate line 'gate' as an output terminal of the gate driving unit.

Optionally, the relay unit 4 comprises:

a first outputting module for providing the first power voltage to the output terminal of the relay unit, that is, outputting the same to the gate line, in response to a pulling-up control signal, namely in response to an output signal of the shift register unit;

a second outputting module for providing the second power voltage to the output terminal of the relay unit, in response to a reset signal;

a third outputting module for providing the second power voltage to the output terminal of the relay unit, in response to a pulling-down control signal, namely in response to a voltage signal at the PD-CN node of the shift register unit.

Optionally, the first outputting module comprises a first thin film transistor with a gate connected to the pulling-up control terminal of the relay unit, a source connected to the first power supply input terminal, and a drain connected to the output terminal of the relay unit.

Optionally, the second outputting module comprises a second thin film transistor with a gate connected to the reset signal terminal of the relay unit, a source connected to the output terminal of the relay unit, and a drain connected to the second power supply input terminal.

Optionally, the third outputting module comprises a third thin film transistor with a gate connected to the pulling-down control terminal of the relay unit, a source connected to the output terminal of the relay unit, and a drain connected to the second power supply input terminal.

Optionally, the shift register unit comprises a plurality of N-type thin film transistors, and the first thin film transistor, the second thin film transistor and the third thin film transistor in the relay unit are all the N-type thin film transistors. The N-type thin film transistor is turned on at a high level and is turned off at a low level.

Optionally, for the shift register units, an input signal terminal of a first stage of shift register unit is connected to a frame start signal, and a reset signal terminal of the first stage of shift register unit is connected to an output terminal of a second stage of shift register unit;

an input signal terminal of a last stage of shift register unit is connected to an output terminal of a previous stage of shift register unit, and a reset signal terminal of the last stage of shift register unit is connected to the frame start signal, or is connected to an outputting terminal of any stage of shift register unit except its previous stage of shift register unit or an output terminal of the relay unit;

except the first stage of shift register unit and the last stage of shift register unit, the input signal terminals of the remaining respective stages of shift register units are connected to the output terminals of their corresponding previous stages of shift register units, and the reset signal terminals thereof are connected to the output terminals of the next stages of shift register units.

The embodiments of the present disclosure will be described below in connection with drawings.

Referring to FIG. 2, the gate driving apparatus according to an embodiment of the present disclosure comprises a plurality of gate driving units 2 connected in cascade, wherein each stage of the gate driving unit 2 comprises a shift register unit 3, for example, S1, S2, and the like in the figure, which comprises a pulling-down control node PD-CN, and each stage of the gate driving unit further comprises a relay unit 4, for example, Z1, Z2 and the like in the figure.

A pulling-up control terminal IN of the relay unit is connected to an output terminal OUTPUT of the shift register unit, a reset signal terminal RET thereof is connected to a reset signal terminal RET of the shift register unit, a pulling-down control terminal thereof is connected to a pulling-down control node PD-CN of the shift register unit, a first power supply input terminal thereof is connected to the first power voltage Vgh, a second power supply input terminal thereof is connected to the second power voltage VSS, and an output terminal OUT of the relay unit is connected to the gate line 'gate' as an output terminal of the gate driving unit.

Herein, the first power voltage Vgh is a high level, and the second power voltage VSS is a low level. An input signal terminal IN of the first stage of shift register unit S1 is connected to a frame start signal STY, the reset signal terminal RET of the first stage of shift register unit S1 is connected to an output terminal OUTPUT of the second stage of shift register unit; an input signal terminal of the last stage of shift register unit is connected to an output terminal of its previous stage of shift register unit, and a reset signal terminal of the last stage of shift register unit is connected to the frame start signal, or is connected to an output terminal of any stage of shift register unit except its previous stage of shift register unit or an output terminal of a relay unit 4; except for the first stage of shift register unit and the last stage of shift register unit, the input signal terminals of the remaining respective stages of shift register units are connected to the output terminals of previous stages of shift register units, and the reset signal terminals thereof are connected to the output terminals of next stages of shift register units.

As illustrated in FIG. 2, a STY, as the frame start signal, provides a driving start control signal to the shift register; CLK and CLKB are a first clock signal and a second clock signal, respectively, and control the shift register to output a high level signal and a low level signal, respectively; a VSS provides a low level maintaining signal to the shift register 3 and the relay unit 4; a Vgh provides a high level signal to a gate signal line through the relay unit 4; and a high level signal output from the relay unit 4 is controlled by an output signal from the shift register 3. Among the above signals, a pulse cycle of the STV is the same as a frame frequency of a display device, the CLK and the CLKB have the same signal pulses but opposite polarities, and the Vgh and the VSS are the high level signal and the low level signal, respectively. During a process of progressive driving, when a first gate driving unit outputs a high level, an output signal at the high level from the shift register unit S1 functions as an input signal of the shift register unit S2 in the second gate driving unit; when the second gate driving unit outputs a high level, the output signal at the high level from the shift register unit S2 functions as a reset signal of the shift register unit S1 and the relay unit Z1 (which makes the output from the shift register unit S1 and the gate signal be at the low levels); and when the S1 and Z1 are reset to the low level, the shift register S1 outputs a PD-CN signal to the relay unit Z1 so as to maintain the output terminal of the relay unit Z1 at the low level.

Similarly, the gate signal lines corresponding to each of the gate driving units outputs progressively a high level to drive a liquid crystal panel to drive progressively the display. The gate driving apparatus is always maintained to output the low level outside periods of time during which it outputs the high level.

Figure 1:
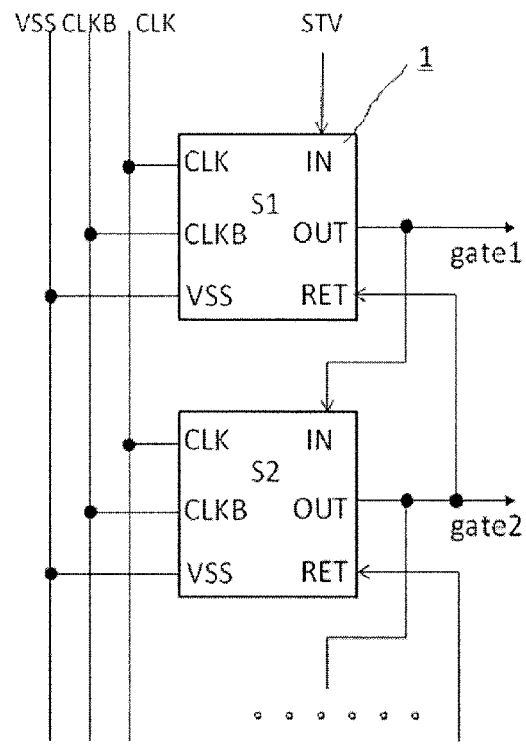
FIG. 1 is a schematic diagram illustrating a structure of a gate driving apparatus in the prior art.
Figure 3:
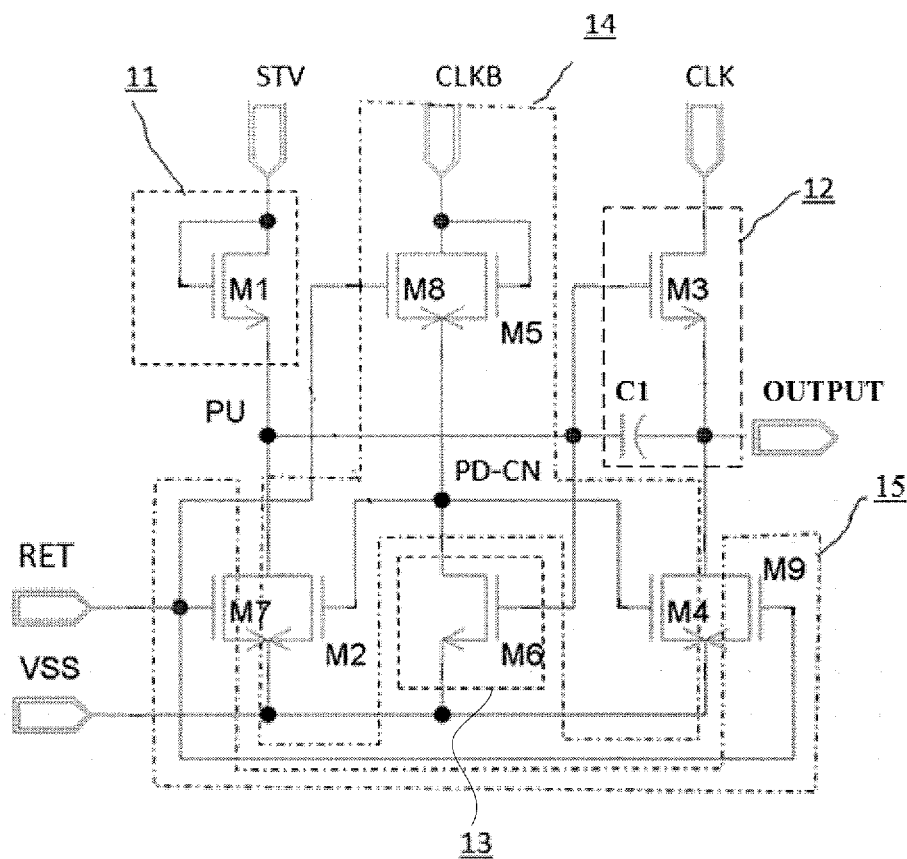
FIG. 3 is a schematic diagram illustrating a structure of a shift register unit in the gate driving apparatus shown in FIG. 1.

FIG. 3 is a schematic diagram illustrating a circuit structure of a shift register unit connected in cascade in the prior art. The shift register unit is used for the prior art shown in FIG. 1 and also may be used for the structure of the gate driving apparatus according to the embodiment of the present disclosure illustrated in FIG. 2. As shown in FIG. 3, regions marked by reference numerals 11, 12, 13, 14 and 15 correspond to a pulling-up driving module, a pulling-up module, a pulling-down controlling module, a pulling-down module and a resetting module in the shift register, respectively.

As illustrated in FIG. 3, the pulling-up driving module 11 of the shift register unit comprises a TFT M1 with a gate and a source connected to a STV signal, and a drain connected to a PU node;

the pulling-up module 12 comprises a TFT M3 and a capacitor C1, a source of the M3 is connected to a first clock signal CLK, a gate thereof is connected to the PU node, and a drain thereof is connected to an output terminal OUTPUT; a first end of the capacitor C1 is connected to the PU node, and a second end thereof is connected to the output terminal OUTPUT;

the pulling-down controlling module 13 comprises a TFT M6 with a gate connected to the PU node, a drain connected to a VSS, and a source used as a PD-CN node;

the pulling-down module 14 comprises TFTs M2, M4, M5 and M8, wherein a source of the M2 is connected to the PU node, a gate thereof is connected to the PD-CN node, and a drain thereof is connected to the VSS; a source of the M4 is connected to the output terminal OUTPUT, a gate thereof is connected to the PD-CN node, and a drain thereof is connected to the VSS; a source and a gate of the M5 are connected to the second clock signal CLKB, and a drain thereof is connected to the PD-CN node; a source of the M8 is connected to the second clock signal CLKB, a gate thereof is connected to the PU node, and a drain thereof is connected to the PD-CN node;

the resetting module 15 comprises TFTs M7 and M9, wherein a source of the M7 is connected to the PU node, a gate thereof is connected to the reset signal terminal RET, and a drain thereof is connected to the VSS; a source of the M9 is connected to the output terminal OUTPUT, a gate thereof is connected to the reset signal terminal RET, and a drain thereof is connected to the VSS.

In the example, the pulling-up driving module 11 receives the high level signal outputting from the previous stage as a start signal, so that a level at the PU node connected with the pulling-up module 12 rises and a level at the PD-CN node is pulled down; when the first clock signal CLK is at the high level, the TFT M3 is turned on, and the shift register unit outputs the high level; when an output from the next stage of shift register unit is the high level (the second clock signal CLKB is at the high level), the RET signal is at the high level, the M7 and M9 are turned on, so that the PU node and the output terminal OUTPUT are pulled down to a low level VSS, and the PD-CN node is pulled up to the high level at the same time; in subsequent high-low level switching processes of the CLKB, the high level at the PD-CN node retains the M2 and M4 to be turned on and maintains the PU node and the output terminal OUTPUT of the shift register to be at the low level.

In the gate driving unit 2 according to the embodiments of the present disclosure, the relay unit 4 receives a voltage signal at the pulling-down node PD-CN outputting from the shift register unit 3, so that the output terminal OUT of the relay unit 4 retains a low level signal.

Figure 4:
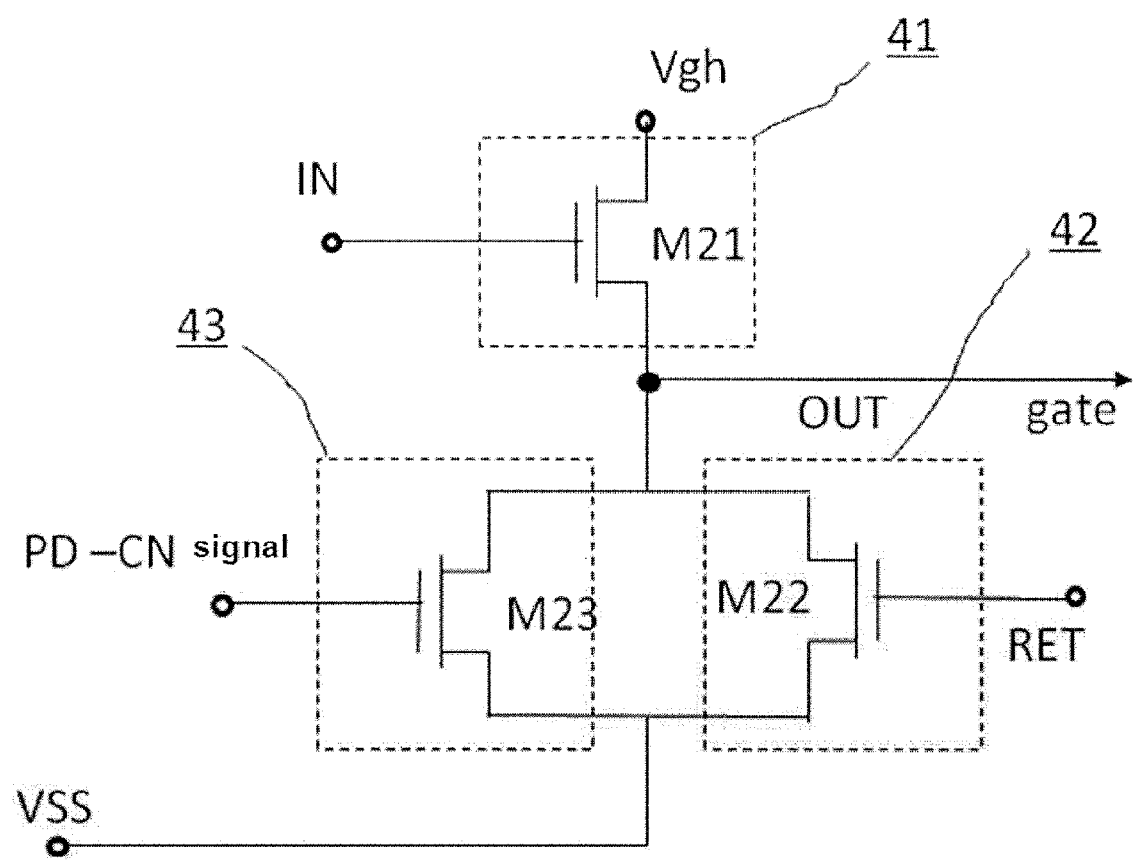
FIG. 4 is a schematic diagram illustrating a structure of a relay unit according to an embodiment of the present disclosure.

FIG. 4 is a schematic diagram illustrating an internal structure of the relay unit 4 in the $n^{th}$ gate driving unit according to an embodiment of the present disclosure. As shown in FIG. 4, the relay unit 4 comprises: a first outputting module 41 for providing the first power voltage Vgh to the output terminal OUT of this relay unit, that is, outputting the same to the gate line, in response to a pulling-up control signal, namely in response to the output signal of the shift register unit; a second outputting module 42 for providing the second power voltage VSS to the output terminal OUT of this relay unit, in response to a reset signal RET; a third outputting module 43 for providing the second power voltage VSS to the output terminal of the relay unit, in response to a pulling-down control signal PD-CN, namely in response to the voltage signal at the PD-CN node of the shift register unit.

Specifically, the first outputting module comprises a first thin film transistor M21 whose gate is connected to the pulling-up control terminal IN of the relay unit, source is connected to the first power supply input terminal Vgh, and drain is connected to the output terminal OUT of the relay unit.

Specifically, the second outputting module comprises a second thin film transistor M22 whose gate is connected to the reset signal terminal RET of the relay unit, source is connected to the output terminal OUT of the relay unit, and drain is connected to the second power supply input terminal VSS.

Specifically, the third outputting module comprises a third thin film transistor M23 whose gate is connected to the pulling-down control terminal PD-CN of the relay unit, source is connected to the output terminal OUT of the relay unit, and drain is connected to the second power supply input terminal VSS.

In the gate driving apparatus according to the embodiments of the present disclosure, all of the thin film transistors in the above shift register unit are N-type thin film transistors, the first thin film transistor, the second thin film transistor and the third thin film transistor in the relay unit are all the N-type thin film transistors. All of the N-type thin film transistors are turned on at a high level and are turned off at a low level.

A detailed operation principle of the relay unit 4 is as follows.

When the shift register n outputs a high level, it shifts to a shift register n+1, at the same time the TFT M21 is turned on so that the output terminal OUT of the relay unit outputs the high level Vgh to the gate line; when the shift register unit n outputs a low level, the TFT M21 is turned off, so that the output terminal OUT of the relay unit is disconnected from Vgh.

When the shift register n+1 outputs the high level, the RET signal is at the high level, the TFT M22 is turned on, so that the VSS signal pulls down the level at the output terminal OUT of the relay unit n, and the gate signal line n is at the low level correspondingly; when the shift register n+1 is reset to the low level, the low level at the output terminal OUT of the relay unit n can not be maintained continually.

At this time, the pulling-down control signal PD-CN of the shift register is high, so that the TFT M23 is turned on and the output terminal OUT of the relay unit 4 is retained to be the low level signal VSS. Thus, with timing signals output from the relay unit, the signal on the gate line can be at the high level when the shift register outputs the high level, and the signal on the gate line can be maintained at the low level outside the periods of time during which the shift register outputs the high level, so that the signal on the gate line can be ensured to be consistent with the output signal from the shift register.

Figure 5:
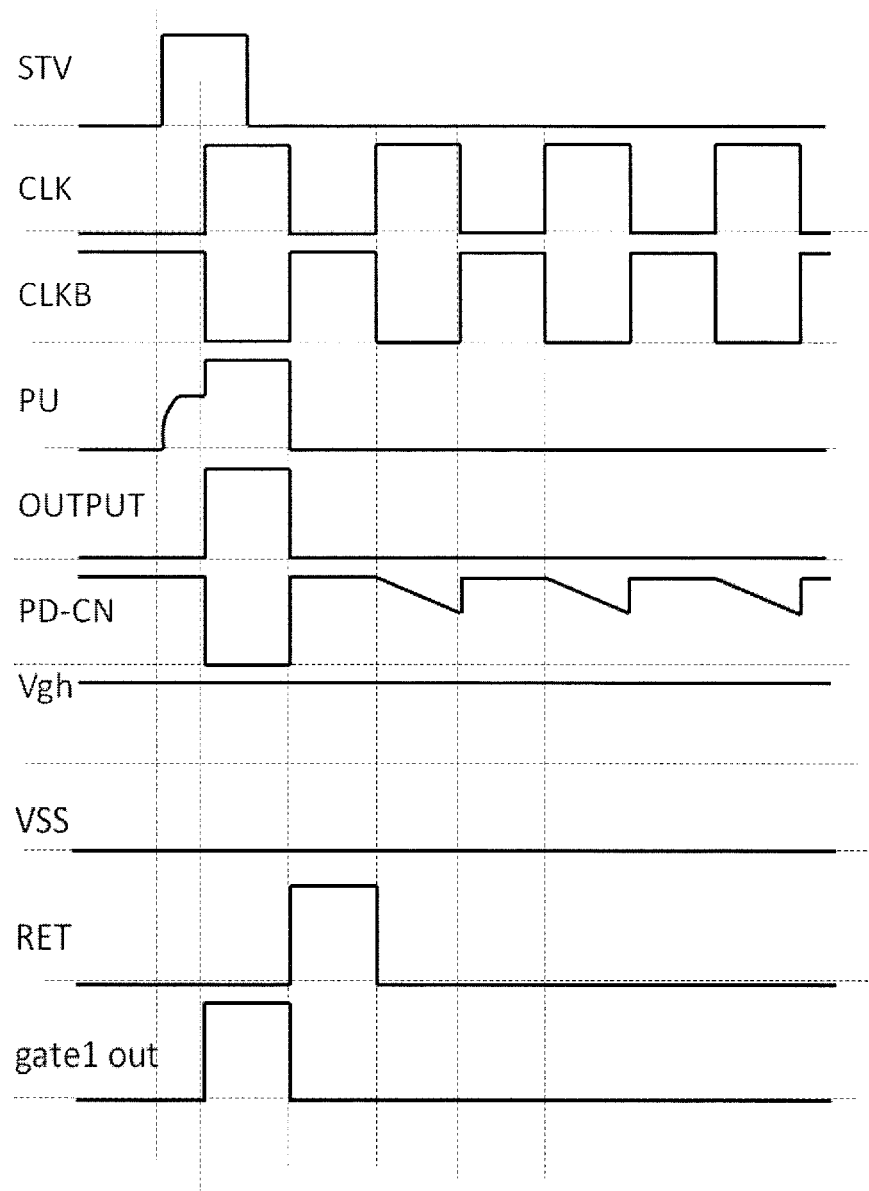
FIG. 5 is a timing chart for respective signal terminals of the gate driving unit according to the embodiments of the present disclosure.

The embodiments of the present disclosure will be described more clearly by referring to a timing chart illustrated in FIG. 5. FIG. 5 illustrates the timing chart for the signals at respective signal terminals, the PU node and the PD-CN node in the first stage of shift register unit, and the signals at the respective signal terminals in the first stage of relay unit, with respect to a process during which the first stage of shift register unit finishes a shift once. It can be seen from the figure that an output signal 'gate1-out' of the first stage of gate driving unit may be maintained to be consistent with the output signal OUTPUT of the shift register completely.

In the gate driving apparatus of the prior art, when the gate line is short-circuited with other wirings at a certain position in a liquid crystal display region, the output signal from the related shift register is abnormal accordingly, such that the output signals from other stages of shift registers are affected to be abnormal, which in turn lead to an abnormality in the signals of corresponding gate lines. As a result, the thin film transistors for driving the display, which are connected to these gate lines, can not operate normally, thereby causing an abnormal display in the full screen finally.

However, in the gate driving apparatus according to the embodiments of the present disclosure, when a gate line is short-circuited with other wirings at a certain position in a liquid crystal display region, only the low level signal VSS and the high level signal Vgh may be affected, but driving abilities of the low level signal VSS and the high level signal Vgh are both strong and not easy to be pulled generally. Meanwhile, in the embodiments of the present disclosure, since the signals from the output terminal of the shift register is not connected to the gate line directly, the gate line short-circuited may not affect the output of the corresponding shift register, which in turn provide normally a normal reset signal to the $(n-1)^{th}$ stage of shift register unit and provide a normal input signal to the $(n+1)^{th}$ stage of shift register unit. Therefore, driving timings and operation states of the gate driving unit may not be disordered and the liquid crystal display device may display normally the remaining regions except for the region(s) affected by the short-circuit. Thus, the abnormality in the full screen display caused by the short-circuit within the panel may be found easily and there are many methods for repairing the short-circuit within the panel of the liquid crystal display device so that a defective product can become a good product by repairing, which improves the product yield.

The above embodiments are described only with respect to the shift register unit in a manner of gate driving using a pair of clock signals (CLK and CLKB), but they are not limited to the shift register unit in such a driving manner. For example, for a shift register unit having many gate lines and using a driving manner with a plurality groups of clock signals, the gate driving apparatus according to the embodiments of the present disclosure is also applicable, wherein the connection mode of the respective signal terminals of the relay unit is the same as that of the embodiments of the present disclosure, and the details are omitted herein.

The embodiments of the present disclosure provide a display device comprising the above gate driving apparatus.

In conclusion, the embodiments of the present disclosure is able to settle the abnormal display in the full screen caused by an abnormality in signals output from the shift register, when a short-circuit occurs in wirings associated with gate lines within a liquid crystal panel, by arranging the relay unit at the output terminal of the shift register unit, making an output signal from the shift register unit of the gate driving apparatus as a pulling-up control signal of the relay unit, and providing an output signal to the gate line by the relay unit, while it is able to enhance the efficiency of analysis for defective phenomena such as the abnormal display etc., and increase the product yield.

Obviously, those skilled in the art may make various amendments and variations to the embodiments of the present disclosure without departing from a spirit and a scope of the present disclosure. Thus, the present disclosure intends to cover such amendments and variations if they fall into the scope defined in claims of the present disclosure and equivalents thereof.

What is claimed is:

1. A gate driving apparatus comprising a plurality of gate driving units connected in cascade, wherein each stage of the gate driving units comprises a shift register unit comprising a pulling-up driving module, a pulling-up module, a pulling-down controlling module, a pulling-down module, and a resetting module, wherein an input terminal of the pulling-down control module is directly connected to a pulling-up node, and an output terminal of the pulling-down control module is directly connected to a pulling-down control node in the pulling-down module, and a relay unit for outputting a first power voltage or a second power voltage to a gate line, wherein the relay unit comprises:
a first outputting module with a pulling-up control terminal directly connected to an output terminal of the shift register unit, for providing the first power voltage to an output terminal of the relay unit, in response to an output signal of the shift register unit;
a second outputting module with a terminal directly connected to a reset signal terminal of the shift register unit, for providing the second power voltage to the output terminal of the relay unit, in response to a reset signal; and
a third outputting module with a pulling-down control terminal directly connected to the pulling-down control node of the shift register unit, for providing the second power voltage to the output terminal of the relay unit, in response to a voltage signal at the pulling-down control node, wherein a first power supply input terminal of the relay unit is directly connected to the first power voltage, a second power supply input terminal thereof is directly connected to the second power voltage, and an output terminal of the relay unit is directly connected to the gate line as an output terminal of the gate driving unit, so that the output terminal of the shift register unit is not directly connected to the gate line directly to avoid the gate line from being shorted-circuited and affecting an output of the corresponding shift register unit, wherein the first outputting module comprises a first thin film transistor whose gate is directly connected to the pulling-up control terminal of the relay unit, source is directly connected to the first power supply input terminal, and drain is directly connected to the output terminal of the relay unit, wherein the second outputting module comprises a second thin film transistor whose gate is directly connected to the reset signal terminal of the relay unit, source is directly connected to the output terminal of the relay unit, and drain is directly connected to the second power supply input terminal, wherein the third outputting module comprises a third thin film transistor whose gate is directly connected to the pulling-down control terminal of the relay unit, source is directly connected to the output terminal of the relay unit, and drain is directly connected to the second power supply input terminal, wherein the pulling-up module comprises of a fourth thin film transistor and a capacitor, the fourth thin film transistor comprises of a gate that is directly connected to the pulling-up node and a first end of the capacitor, and a drain directly connected the output terminal of the shift register and a second end of the capacitor, wherein the pulling-down controlling module comprises of a fifth thin film transistor, a gate of the fifth thin film transistor is directly connected to the pulling-up node, a source of the fifth thin film transistor is directly connected to the pulling-down control node, and a drain of the fifth thin film transistor is directly connected to the second power voltage, wherein the resetting module comprises of a sixth thin film transistor and a seventh thin film transistor, the sixth thin film transistor comprises of a gate directly connected to the reset signal terminal, a source directly connected to the pulling-up node, and a drain directly connected to the second power voltage, and the seventh thin film transistor comprises of a gate directly connected to the reset signal terminal, a source directly connected to the output terminal of the shift register, and a drain directly connected to the second power voltage.

2. The gate driving apparatus of claim 1, wherein all of the thin film transistors are N-type thin film transistors.

3. The gate driving apparatus of claim 1, wherein
an input signal terminal of a first stage of shift register unit is connected to a frame start signal, and a reset signal terminal of the first stage of shift register unit is connected to an output terminal of a second stage of shift register unit;

an input signal terminal of a last stage of shift register unit is connected to an output terminal of a previous stage of shift register unit, and a reset signal terminal of the last stage of shift register unit is connected to the frame start signal, or is connected to an output terminal of any stage of the shift register units except for its previous stage of shift register unit or an output terminal of a relay unit;

except for the first stage of shift register unit and the last stage of shift register unit, the input signal terminals of the remaining respective stage of shift register units are connected to the output terminals of their previous stage of shift register unit, and the reset signal terminals thereof are connected to the output terminals of next stage of shift register unit.

4. The gate driving apparatus of claim 3, wherein all of the thin film transistors are N-type thin film transistors.

5. A display device, comprising a gate driving apparatus, wherein the gate driving apparatus comprises a plurality of gate driving units connected in cascade, wherein each stage of the gate driving units comprises a shift register unit comprising a pulling-up driving module, a pulling-up module, a pulling-down controlling module, a pulling-down module, and a resetting module, wherein an input terminal of the pulling-down control module is directly connected to a pulling-up node, and an output terminal of the pulling-down control module is directly connected to a pulling-down control node in the pulling-down module, and a relay unit for outputting a first power voltage or a second power voltage to a gate line, wherein the relay unit comprises:
a first outputting module with a pulling-up control terminal directly connected to an output terminal of the shift register unit, for providing the first power voltage to an output terminal of the relay unit, in response to an output signal of the shift register unit;

a second outputting module with a terminal directly connected to a reset signal terminal of the shift register unit, for providing the second power voltage to the output terminal of the relay unit, in response to a reset signal; and a third outputting module with a pulling-down control directly terminal connected to the pulling-down control node of the shift register unit, for providing the second power voltage to the output terminal of the relay unit, in response to a voltage signal at the pulling-down control node, wherein a first power supply input terminal of the relay unit is directly connected to the first power voltage, a second power supply input terminal thereof is directly connected to the second power voltage, and an output terminal of the relay unit is directly connected to the gate line as an output terminal of the gate driving unit, so that the output terminal of the shift register unit is not directly connected to the gate line directly to avoid the gate line shorted-circuited from affecting an output of the corresponding shift register unit, wherein the first outputting module comprises a first thin film transistor whose gate is directly connected to the pulling-up control terminal of the relay unit, source is directly connected to the first power supply input terminal, and drain is directly connected to the output terminal of the relay unit, wherein the second outputting module comprises a second thin film transistor whose gate is directly connected to the reset signal terminal of the relay unit, source is directly connected to the output terminal of the relay unit, and drain is directly connected to the second power supply input terminal, wherein the third outputting module comprises a third thin film transistor whose gate is directly connected to the pulling-down control terminal of the relay unit, source is directly connected to the output terminal of the relay unit, and drain is directly connected to the second power supply input terminal, wherein the pulling-up module comprises of a fourth thin film transistor and a capacitor, the fourth thin film transistor comprises of a gate that is directly connected to the pulling-up node and a first end of the capacitor, and a drain directly connected the output terminal of the shift register and a second end of the capacitor, wherein the pulling-down controlling module comprises of a fifth thin film transistor, a gate of the fifth thin film transistor is directly connected to the pulling-up node, a source of the fifth thin film transistor is directly connected to the pulling-down control node, and a drain of the fifth thin film transistor is directly connected to the second power voltage, wherein the resetting module comprises of a sixth thin film transistor and a seventh thin film transistor, the sixth thin film transistor comprises of a gate directly connected to the reset signal terminal, a source directly connected to the pulling-up node, and a drain directly connected to the second power voltage, and the seventh thin film transistor comprises of a gate directly connected to the reset signal terminal, a source directly connected to the output terminal of the shift register, and a drain directly connected to the second power voltage.

6. The display device of claim 5, wherein all of the thin film transistors are N-type thin film transistors.

* * * * *